United States Patent
Takano

(10) Patent No.: US 6,744,018 B2
(45) Date of Patent: Jun. 1, 2004

(54) SUBSTRATE PROCESSING APPARATUS AND METHOD FOR MANUFACTURING SEMICONDUCTOR DEVICE

(75) Inventor: Satoshi Takano, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 10/259,762

(22) Filed: Sep. 30, 2002

(65) Prior Publication Data

US 2003/0183613 A1 Oct. 2, 2003

(30) Foreign Application Priority Data

Mar. 27, 2002 (JP) ........................................ 2002-089028

(51) Int. Cl.⁷ ................................................ F27B 5/14
(52) U.S. Cl. ....................... 219/390; 219/405; 219/411; 392/416; 392/418; 118/724; 118/725; 118/50.1
(58) Field of Search ................................. 219/390, 405, 219/411; 392/416, 418; 118/724, 725, 50.1

(56) References Cited

U.S. PATENT DOCUMENTS 6,225,601 B1 * 5/2001 Beer et al. .................. 219/390

FOREIGN PATENT DOCUMENTS

| JP | A 6-260426 | 9/1994 |
| JP | A 7-316811 | 10/1995 |

* cited by examiner

*Primary Examiner*—Shawntina Fuqua
(74) *Attorney, Agent, or Firm*—Oliff & Berridge, PLC

(57) ABSTRACT

A substrate processing apparatus and a method for manufacturing semiconductor device can inhibit an elastic deformation of a substrate due to a temperature difference in a substrate surface during a substrate temperature raising process so that a substrate processing such as a film formation and the like can be performed in a temperature uniform state in a substrate surface. The substrate processing apparatus is adapted to heat a substrate 1 on a susceptor 2 by a division type resistance heating heater 3 which can perform an unequal heating in a substrate surface. Such a temperature deviation Δt in a substrate surface represented by:

$$\Delta t \leq 350 \times EXP(-0.004 \times T),$$

wherein T is a substrate temperature, is obtained that no warpage of the substrate 1 occurs in accordance with a temperature of the substrate 1 when heating. Heating of the substrate 1 is controlled by controlling the resistance heating heater 3 such that the temperature deviation in a surface of the substrate 1 heated by the resistance heating heater 3 is maintained within the above-noted Δt.

14 Claims, 8 Drawing Sheets

SUBSTRATE PROCESSING APPARATUS AND METHOD FOR MANUFACTURING SEMICONDUCTOR DEVICE

BACKGROUND OF THE INVENTION

1. Field of the Invention

This invention relates to a substrate processing apparatus and a method for manufacturing a semiconductor device, 2. Description of the Related Art In an individual substrate type substrate processing apparatus, a substrate is typically processed in a state in which the substrate is forcefully adsorbed onto a susceptor. In this case, if a degree of contact of the substrate with the susceptor remains uncontrolled, there is a problem that the substrate with a bad degree of contact will have a remarkably deteriorated substrate property when moving to a subsequent film formation step.

In the individual substrate type substrate processing apparatus, as shown in FIG. 3, in a state in which a substrate 1 is adsorbed and supported onto a susceptor 2 which is heated by a resistance heating heater 3, a gas is blown like a shower on the substrate 1 from a gas dispersion plate 5 which is located above the substrate 1, and consequently, a processing such as a film formation and the like will be performed on the substrate 1. A surface of the resistance heating heater 3 heats the susceptor 2 such that a temperature of the susceptor 2 is always maintained at a constant temperature.

Here, when warpage amounts d1 and d2 representing a degree of contact change which are space distances from the substrate 1 to the susceptor 2, a heat of the susceptor 2 which is always uniformly heated in an unchanging state by the resistance heating heater 3 can not be equally transferred to the substrate 1. As a result, a malfunction occurs a the substrate surface, as will be described below, due to temperature distribution nonuniformity depending on the above-noted substrate warpage amount d (a generic name for dl an d2)

Here, a warpage amount of a substrate refers to a maximum value of a gap formed between the susceptor 2 surface and the substrate 1 underside due to an uncontacted portion of the substrate 1 with the susceptor 2 occurring as a result of a deformation of the substrate 1 In a state in which the substrate 1 is supported onto the surface the susecptor 2.

The longer the distance d between the substrate 1 and the susceptor 2 is, the worse thermal conductivity from the susceptor 2 is. Accordingly, the temperature in the substrate surface will have thermal variations generated depending on the distance d. As a result, in the case of d1>d2, the substrate temperature near d2 is higher than the substrate temperature near d1.

In a technique with regard to such a warpage of a substrate, there are conventionally known examples as follows.

(a) Japanese Patent Application Laid-Open No. 7-316811

Since occurrence of a large difference in a temperature distribution in a wafer generates a warpage in the wafer which leads to a cause for occurrence of a slip and the like, an attempt has been made to realize uniformity in the temperature in the wafer surface when being in a steady state or in a transient state (when raising a temperature) by allowing a heating state of a division type heater to be variable based on temperature differences between respective zones in the wafer each temperature of which is measured with a thermocouple.

In addition, heating of the temperature difference in the surface of the wafer, mentioned here, is controlled such that the temperature difference is equal to 10° C. or less based on a maximum temperature difference 10° C. wherein no warpage occurs at a processing temperature of 300° C. That is, the temperature difference value is controlled by one fixed temperature difference in the surface.

(b) Japanese Patent Application Laid-Open No. 6-260426

Since a contact area between a wafer and a susceptor changes due to deformation of the wafer when raising a temperature, the change will affect an outermost circumferential temperature of the wafer so that a temperature difference in the surface occurs to generate a slip.

Therefore, temperature measuring points and a heating method are disclosed in order to inhibit the slip from occurring. That is, by measuring temperatures at a plurality of points of a circumferential portion of the wafer at a distance equal to 70% or more of a radius of the wafer from a center of it, and by controlling heating of a heater such that a temperature difference between the temperature measuring points is within 5° C. (this value is a value wherein no slip occurs at 800° C. or more), a heating processing without occurrence of a slip is performed without depending uniformity in a heat density of the heater and without depending a contact area between the wafer and the susceptor.

However, in the above-described prior art, there have been problems as follows.

(1) In the known example (a), a temperature rise is controlled by one value of a temperature difference $\Delta t$ in the surface (a value wherein no warpage occurs at a processing temperature (at a setpoint temperature when raising a temperature)). Since this makes it required that the heating be severely controlled when being at a low wafer temperature with a large margin of a $\Delta t$, by using a $\Delta t$ when being at a high temperature (the $\Delta t$ when being at a low wafer temperature is larger than the $\Delta t$ when being at a high wafer temperature), restriction on a control response is required so as to make a sacrifice of a temperature rising speed. As a result, since the $\Delta t$ margin becomes also small when being at a low temperature, a warpage can be inhibited, however, it can not be ensured that the temperature rising speed is increased.

(2) In the known example (b) which is similar to the known example (a), since heating is controlled by one value (a temperature difference in the surface), there is also a defect similar to the one in the known example (a).

SUMMARY OF THE INVENTION

An object of the present invention is to provide a method for processing a substrate and a method for manufacturing a semiconductor device wherewith, by resolving the problems with the prior art noted in the foregoing, occurrence of a warpage of a substrate can be effectively prevented.

A first invention is a substrate processing apparatus which heats a substrate using a heating member capable of performing an unequal heating in a substrate surface, comprising a controller, the controller being adapted to obtain in accordance with a heating state of the substrate such a temperature deviation $\Delta t$ in the substrate surface, which varies in accordance with the heating state of the substrate, that no warpage of the substrate occurs, and the controller being adapted to control the heating member such that a temperature deviation in the surface of the substrate which is heated by the heating member is maintained within the $\Delta t$. Since heating of the substrate can be controlled based on the temperature deviation $\Delta t$ in the substrate surface, occurrence of a warpage of the substrate can be effectively prevented. Moreover, since the temperature deviation Δt in the substrate surface is allowed not to be fixed but to be variable, heating need not be severely controlled when the substrate is at a low temperature with a large margin of a Δt, by using a Δt value when being at a high temperature. Accordingly, since the heating is controlled with a large Δt margin when being at a low temperature, it can be ensured that the temperature rising speed is increased while a warpage can be inhibited at the same time. The above-noted heating member capable of performing an unequal heating in the substrate surface is, for example, a division type heater which is divided into a plurality of zones.

A second invention is a substrate processing apparatus which heats a substrate using a heating member capable of performing an unequal heating in a substrate surface, comprising a controller, the controller being adapted to obtain a Δt, which varies in accordance with a temperature when heating, for each of a plurality of temperatures which are selected from the temperatures when heating, the temperature when heating being a temperature of the substrate or a temperature of a substrate support member for supporting the substrate, the Δt being such a temperature deviation in the substrate surface that no warpage of the substrate occurs, and the controller being adapted to control the heating member such that a temperature deviation in the surface of the substrate which is heated by the heating member is maintained within the Δt based on the temperature of the substrate support member or the substrate temperature at that time. Since there is a correlation between the substrate temperature and the substrate support member temperature, the temperature deviation Δt in the substrate surface may be obtained from either of the temperatures. In either event, since the control is performed by the temperature deviation Δt in the substrate surface, which varies in accordance with the temperature of the substrate support member or the substrate when heating, that can be easily measured, it can be ensured that the temperature rising speed is increased while a warpage of the substrate can be prevented at the same time.

A third invention is a substrate processing apparatus according to the second invention, wherein the temperature deviation Δt in the substrate surface which is obtained in accordance with the temperature of the substrate when heating, is represented by the following expression:

$$\Delta t \leq 350 \times EXP(-0.004 \times T),$$

wherein T is the temperature of the substrate.

Since heating of the substrate is controlled by the temperature deviation Δt in the substrate surface represented by the above expression, a warpage of the substrate can be prevented effectively over the whole temperature of the substrate.

A fourth invention is a substrate processing apparatus according to the third invention, wherein a size of the substrate is 12 inches, the Δt is a temperature deviation in a surface between a center of the substrate and a position of 145 mm from the substrate center. For the substrate size of 12 inches, if the temperature deviation in the surface between the center of the substrate and the position of 145 mm from the substrate center is obtained, it can be ensured that heating control of the substrate is optimized when performing the control of the heating member.

A fifth invention is a substrate processing apparatus according to the second invention, wherein the temperature deviation Δt in the substrate surface is obtained in accordance with a temperature of the substrate support member for supporting the substrate. Since the temperature deviation Δt in the substrate surface is obtained by measuring not the substrate temperature but the substrate support member temperature, it is possible to make a thermometer impervious to a substrate processing as compared with a case in which the substrate temperature susceptible to the substrate processing is measured, so that reliability of control is increased.

A sixth invention is a substrate processing apparatus according to the fifth invention, wherein as the temperature of the substrate support member, a temperature of a back surface of the substrate support member opposite to a surface which supports the substrate is measured. Since there is no need to expose a thermometer to a processing space owing to the measurement of the back surface temperature of the substrate support member, an unnecessary film and the like can be prevented from being deposited on the thermometer so that the reliability is further increased.

A seventh invention is a substrate processing apparatus according to the first invention or the second invention, wherein the control of the heating member is a control during a temperature raising process of the substrate. Since a warpage of the substrate, which is not eliminated when processing the substrate, due to variations of the temperature in the substrate surface which have a possibility of occurrence during a temperature raising process, can be surely eliminated, defective processing of the substrate caused by the temperature nonuniformity due to the warpage of the substrate can be reduced.

An eighth invention is a substrate processing apparatus, which heats a substrata using a heating member capable of performing an unequal heating in a substrate surface, and which controls heating of the substrate at least between a first temperature and a second temperature which is different from the first temperature, the substrate processing apparatus comprising a controller, the controller controlling the heating of the substrate such that a temperature deviation in the substrate surface is maintained within a range of such a temperature deviation in the substrate surface that no warpage of the substrate occurs, and wherein a temperature deviation value in the substrate surface at the first temperature and a temperature deviation value in the substrate surface at the second temperature are set to be different, and the heating of the substrate is controlled by using these temperature deviation values which are different values from each other. Since heating of the substrate is controlled based on at least two different temperature deviations in the substrate surface, occurrence of a warpage of a substrate can be prevented with a sufficient control margin as compared with a substrate processing apparatus for controlling heating of a substrate based on one fixed temperature deviation in a substrate surface.

A nineth invention is a substrate processing apparatus according to the eighth invention, wherein the second temperature is a temperature higher than the first temperature, the temperature deviation value in the substrate surface at the first temperature is a value larger than that of the temperature deviation value in the substrate surface at the second temperature, and the heating of the substrate is controlled by using these temperature deviation values which are different values from each other. Since the temperature deviation value in the substrate surface at the first temperature is allowed to be a value larger than that of the temperature deviation value in the substrate surface at the second temperature, a further sufficient margin can be secured during a temperature raising process in which the substrate temperature becomes the first temperature.

A tenth invention is a method for manufacturing a semiconductor device, which heats a substrate using a heating member capable of performing an unequal heating in a substrate surface, the method being adapted to control heating of the substrate by: obtaining in accordance with a heating state of the substrate such a temperature deviation Δt in the substrate surface, which varies in accordance with the heating state of the substrate, that no warpage of the substrate occurs; and controlling the heating member such that a temperature deviation in the surface of the substrate which is heated by the heating member is maintained within the Δt. Since heating of the substrate is controlled based on the temperature deviation Δt in the substrate surface, occurrence of a warpage of the substrate can be effectively prevented. In addition, since the temperature deviation Δt in the substrate surface is allowed not to be fixed but to be variable, heating need not be severely controlled when the substrate is at a low temperature with a large margin of a Δt, by using a Δt value when being at a high temperature. Accordingly, since the Δt margin is large when being at a low temperature, it can be ensured that the temperature rising speed is increased while a warpage can be inhibited.

An eleventh invention is a method for manufacturing a semiconductor device, which heats a substrate using a heating member capable of performing an unequal heating in a substrate surface, the method being adapted to control heating of the substrate by: obtaining a Δt, which varies in accordance with a temperature when heating, for each of a plurality of temperatures which are selected from the temperatures when heating, the temperature when heating being a temperature of the substrate or a temperature of a substrate support member for supporting the substrate, the Δt being such a temperature deviation in the substrate surface that no warpage of the substrate occurs; and controlling the heating member such that a temperature deviation in the surface of the substrate which is heated by the heating member is maintained within the Δt based on the temperature of the substrate support member or the temperature of the substrate at that time. Since there is a correlation between the substrate temperature and the substrate support member temperature, the temperature deviation Δt in the substrate surface may be obtained by either of the temperatures. In either event, since the control is performed within the temperature deviation Δt in the substrate surface which varies in accordance with the temperature of the substrate support member or the substrate when heating, that can be easily measured, it can be ensured that the temperature rising speed is increased while a warpage of the substrate can be inhibited.

A twelfth invention is a method for manufacturing a semiconductor device, which heats a substrate using a heating member capable of performing an unequal heating in a substrate surface, and controls heating of the substrate at least between a first temperature and a second temperature which is different from the first temperature, the method comprising: controlling heating of the substrate such that a temperature deviation in a surface of the substrate is maintained within a range of such a temperature deviation in the substrate surface that no warpage of the substrate occurs; and setting a temperature deviation value in the substrate surface at the first temperature and a temperature deviation value in the substrate surface at the second temperature to be different, and controlling the heating of the substrate by using these temperature deviation values which are different values from each other. Since heating of the substrate is controlled based on at least two different temperature deviations in the substrate surface, occurrence of a warpage of a substrate can be prevented with a sufficient control margin as compared with a method for controlling heating of a substrate based on one fixed temperature deviation in a substrate surface.

DESCRIPTION OF THE PREFERRED EMBODIMENTS

An embodiment of a substrate processing apparatus and a method for manufacturing a semiconductor device according to the present invention will be explained below in the case of its application to an individual substrate type substrate processing apparatus. Moreover, although the individual substrate type will be explained here with respect to a single substrate type which performs a processing for every single substrate, the individual substrate type, which is not limited to a single substrate type, is applicable to an apparatus in a form wherein substrates of the order of 2 to 5, or more, are horizontally loaded on a substrate support member.

Figure 1:
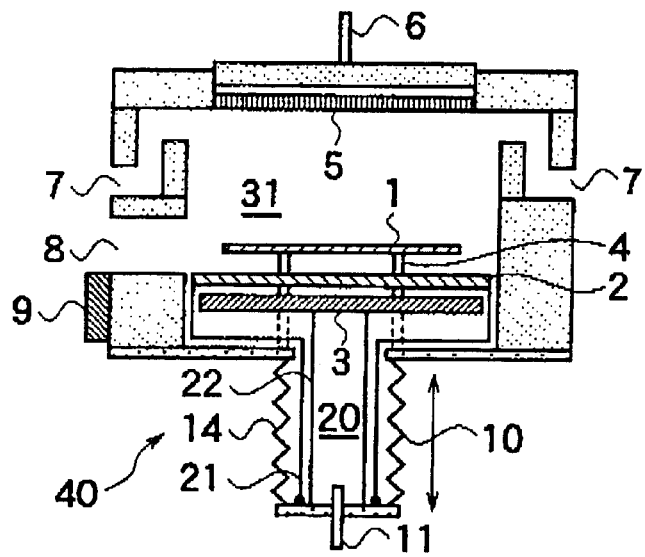
FIG. 1 is a schematic sectional view of an individual substrate type substrate processing apparatus according to an embodiment.
Figure 2:
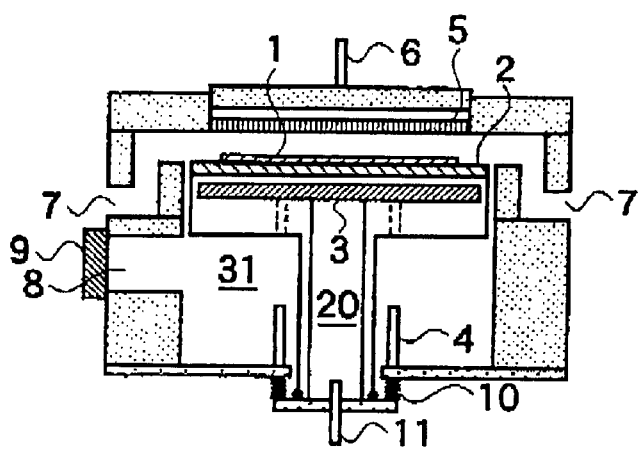
FIG. 2 is a schematic sectional view of an individual substrate type substrate processing apparatus according to an embodiment.

FIG. 1 and FIG. 2 are schematic sectional views of individual substrate type substrate processing apparatuses for performing a thin film formation and a thermal processing in order to conduct a method for manufacturing a semiconductor device.

The apparatus comprises a processing vessel 40 of a sealed structure. The processing vessel 40 comprises a substrate insertion port 8 for transferring a semiconductor substrate 1 such as a silicon wafer and the like from a transfer chamber (not shown) into a processing chamber 31 in the processing vessel 40, and an open/close valve 9 which performs atmosphere isolation between the transfer chamber and the processing chamber 31. In addition, there are provided a gas supply port 6 through which a desired gas species, a gas flow rate and a gas ratio can be supplied into the processing chamber 31, and an exhaustion port 7 for exhausting a supply gas. A gas dispersion plate 5 for preventing a gas supply amount from being biased on a substrate processing surfaces is provided at an upper portion of the processing chamber 31 at which the gas supply port 6 Is provided.

A susceptor 2 as a substrate support member for supporting the substrate 1 and a heater unit 20 for heating the substrate 1 via the susceptor 2 are provided in the processing chamber 31. The susceptor 2 adsorbs and supports the substrate 1 on a surface of the susceptor 2, and uniformalizes a heat from the resistance heating heater 3 as a heating member in a state in which the substrate 1 is adsorbed and supported.

The heater unit 20 which is constructed from a hollow body comprises at its upper portion a substrate support plate attachment portion for attaching a substrate support body 2, and comprises at its lower portion a tubiform support shaft 21 which advances or retreats from an opening provided at a bottom portion center of the vacuum vessel 40. The heater unit 20 becomes a sealed structure by attaching the susceptor 2 to the substrate support plate attachment portion of the heater unit 20. The resistance heating heater 3 which can heat the substrate 1 to a desired temperature via the susceptor 2 is provided inside of the hollow body. In addition, the hollow body which becomes a sealed structure is provided with a vacuum exhaustion line 11, and the substrate 1 will be forcefully adsorbed to the surface of the susceptor 2 by evacuating the heater unit 20 to vacuum. The susceptor 2 is provided with a plurality of holes or grooves for vacuum adsorption.

The heater unit 20 is vertically movably provided in the processing chamber 31 by connecting the support shaft 21 of the heater unit 20 to a vertical movement mechanism 10. The support shaft is sealed with a bellows 14. The vertical movement mechanism 10 is adapted to be able to adjust in a multistage manner the heater unit 20 at different vertical positions in the processing chamber 31 in each step such as during substrate transfer, substrate processing, and the like. Substrate support pins 4 as substrate support tools for temporarily supporting the substrate 1 transferred into the processing chamber 31, are provided with the susceptor 2 such that the pins 4 can freely appear or sink in accordance with the vertical movement of the heater unit 20.

In the construction as noted above, although the substrate 1 is adsorbed and supported on the susceptor 2, the entire surface of the substrate can not always be adsorbed uniformly to the susceptor 2, and a warpage amount of the substrate can not be controlled. Therefore, in order to be able to obviate a warpage, the heater unit 20 is constructed in the following manner.

The heater unit 20 is adapted to be rotatable, and a temperature of the susceptor 2 is adapted to be measurable. That is, the above-stated tubiform support shaft 21 is adapted to be rotatable, and the heater unit 20 is provided such that the heater unit 20 can be freely rotated with the support shaft 21 as a center, so that the susceptor 2 can be rotated at an arbitrary speed in a state in which the substrate 1 is supported. On the other hand, the resistance heating heater 3 is fixedly provided in the heater unit 20, and supported by a fixture 22 which is inserted into the tubiform support shaft 21. In this way, by allowing the susceptor 2 to be rotatable and the resistance heating heater 3 to be fixed, the susceptor 2 is allowed to be rotated relatively to the resistance heating heater 3. In addition, by allowing the heater unit 20 to be rotatable, the heater unit 20 becomes vertically movable and rotatable, and known means, not shown, can be adopted as a multiple mechanism having such vertical movement and rotation functions. Moreover, the resistance heating heater 3 is provided with a thermometer which is not shown in FIG. 1 or FIG. 2, for measuring a temperature of the susceptor 2. Additionally, the gas dispersion plate 5 is provided with a thermometer for measuring a temperature of the substrate 1.

A method for manufacturing a semiconductor device using the above-stated individual substrate type substrate processing apparatus will be described below.

(1) Firstly, pressures of the transfer chamber (not shown) and the processing chamber 31 are adjusted to prescribed pressures, respectively. The adjustment of the pressures is performed by supplying a noble gas such as $N_2$, Ar or the like which has no reactivity with the substrate surface, into the respective chambers so as to adjust a conductance of the exhaustion port 7. Although, here, the pressure of each chamber is set to be, for example, of the order of 13,300 Pa (100 Torr), the pressure should be determined preferably depending on thin film formation and heat processing pressures of a substrate and the like, and an optimal pressure for each substrate processing condition is preferable.

(2) Next, the open/close valve 9 is opened, and the substrate 1 is inserted into the processing chamber 31 from the transfer chamber via the substrate insertion port 8, and subsequently, the substrate 1 is temporarily supported with the substrate support tools 4 (FIG. 1). In addition, it is preferable that a pressure difference between the transfer chamber and the processing chamber 31 when opening the open/close valve 9 be monitored and controlled to be in an arbitrary range such that the pressure difference may be prevented from being a factor in occurrence of particles by pressure fluctuations. After insertion of the substrate 1, the open/close valve 9 is closed to perform atmosphere isolation between the processing chamber 31 and the transfer chamber. Then, by allowing the heater unit 20 to move up by the vertical movement mechanism 10, the substrate 1 is supported with the susceptor 2, and then, the heater unit 20 is allowed to further move up while the substrate 1 is supported with the susceptor 2, so that the substrate 1 is located at a film formation position (FIG. 2). Additionally, by adjusting a thin film formation apparatus, a gap between the gas dispersion plate 5 and the substrate 1 can be controlled, and the gap is optimized by thin film formation conditions.

(3) Subsequently, a valve (not shown) connected to the vacuum exhaustion line 11 is opened, and a pressure of an inside of the heater unit 20 is reduced to be lower than that of an atmosphere of the substrate, and the substrate 1 is forcefully adsorbed to the susceptor 2 by sucking a back surface of the substrate through the plurality of holes or grooves with which the susceptor 2 is provided. Then, by rotating the heater unit 20, the susceptor 2 is rotated in a state in which the substrate 1 is supported.

(4) The resistance heating heater 3 for heating the substrate 1 is previously set prior to the substrate transfer such that the substrate 1 in a state of FIG. 2 may reach an intended processing temperature, and an attempt is made to stabilize the temperature of the substrate in this state until the substrate reach the intended processing temperature. If the substrate temperature becomes stable, a reaction gas for performing a desired film formation is introduced from the gas supply port 6, and a thin film is formed on the surface of the substrate 1.

Figure 3:
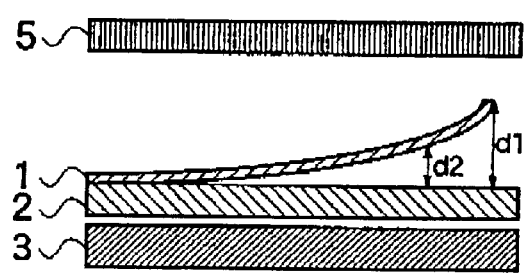
FIG. 3 is an explanatory view for showing a nonuniformity occurrence model of a temperature in a substrate surface.

(5) The supply of the reaction gas is stopped immediately after passing of a period of time required to form a thin film passes, and a remaining gas component of the reaction gas is exhausted. Then, in the inverse procedures of the above-stated (1) to (3) items, the substrate 1 is delivered from the processing chamber to the transfer chamber, and subsequently, these operations are repeatedly performed until a processing of a prescribed number of substrates is completed However, during a processing of the above-noted (2) to (4), because the substrate is heated by the resistance heating heater 3 immediately after the transfer of the substrate 1 into the processing chamber 31, and because, conventionally, this heating is in an actually uncontrolled state with respect to the substrate temperature, there may be sometimes a certain amount or more of a temperature deviation in a surface of the substrate when raising a temperature. Thermal expansion typically occurs in the processing substrate 1 due to heating, and if the above-noted temperature deviation reaches a certain amount or mores an elastic deformation having a shape of a horseshoe or a cone is generated in the substrate. This elastic deformation continues being maintained even in a thin film formation process after stabilization of temperature, and it further causes temperature nonuniformity in the substrate surface so as to become a deterioration factor of a substrate property such as a film thickness nonuniformity and the like during a thin film formation processing. As shown in FIG. 3 noted above, if a degree of contact (a space distance) of the substrate 1 with the susceptor 2 changes, a heat of the susceptor 2 which is uniformly heated always in an unchanging state by the resistance heating heater 3 can not be uniformly transferred to the substrate 1. As a result, a drawback occurs in the substrate surface due to temperature distribution nonuniformity depending on the space distance.

Because the deficiency of the substrate property due to the above-mentioned temperature nonuniformity in the substrate allows a performance and a yield of devices to be lowered, and because the excess elastic deformation of a substrate the amount of which reaches d=10 mm or more for a φ 300 mm (12 inches) Si substrate causes even unexpected apparatus troubles such as transfer troubles resulting from position displacement of a substrate, and the like, the improvement is desired. Therefore, in the present embodiment, by reducing the deformation amount due to the excess elastic deformation of a substrate, the unexpected apparatus troubles are prevented from occurring, as follows.

Figure 11:
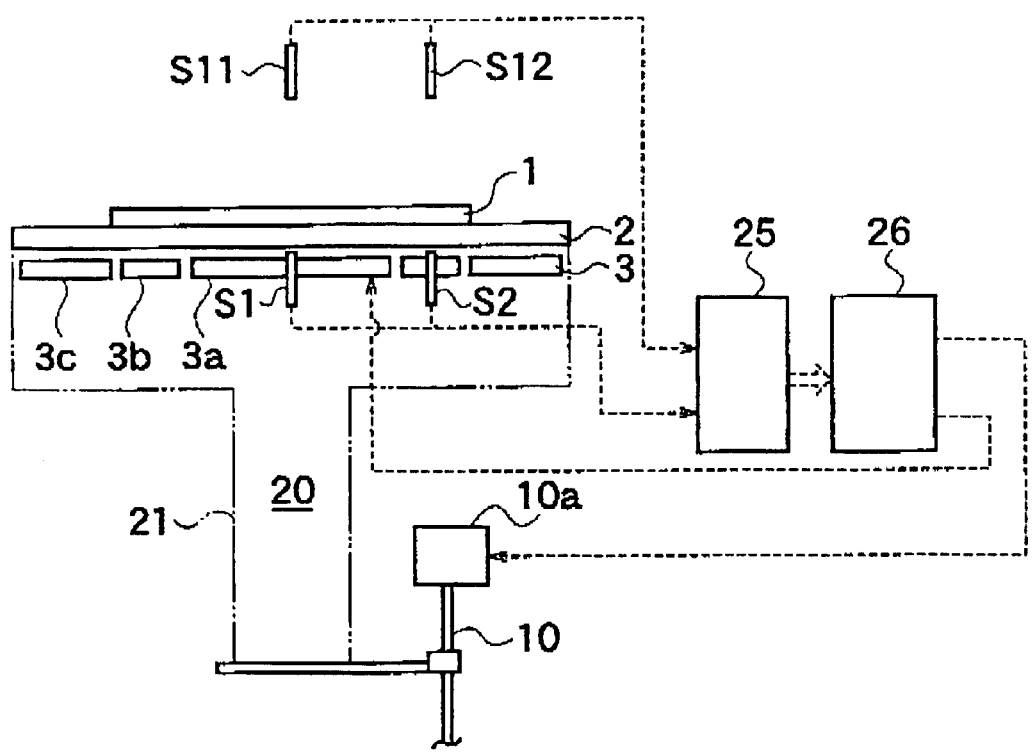
FIG. 11 is an explanatory view for showing a control system according to an embodiment.

FIG. 11 is an explanatory view for showing a control system according to an embodiment. As shown in FIG. 11, the resistance heating heater 3 is provided with, for example, radiation thermometers S1 and S2 as temperature measurement means for the susceptor 2. The radiation thermometers S1 and S2 which comprise sensor portions located to face a back surface of the susceptor 2, are adapted to be able to measure the temperature of the susceptor 2 from its back surface side so as to monitor the temperature of the susceptor 2 from the measured value. The location positions are set to be at least two points including substrate center portion and substrate end portion neighborhoods. If one point is further located at an intermediate point between the above-mentioned two points, a preferable configuration for more precisely controlling a substrate warpage amount as hereinafter described is obtained.

In addition, the gas dispersion plate 5 (see FIG. 1 and FIG. 2) is provided with, for example, radiation thermometers S11 and 512 as temperature measurement means for the substrate 1. The radiation thermometers S11 and S12 which comprise sensor portions located to face a surface of the substrate 1, are adapted to be able to measure the temperature of the substrate 1 from its surface side so as to monitor the temperature of the substrate 1 from the measured value. The location positions are set to be at least two points including substrate center portion and substrate end portion neighborhoods. If one point is further located at an intermediate point between the above-mentioned two points, a preferable configuration for more precisely controlling a substrate warpage amount as hereinafter described is obtained.

Moreover, the above-described thermometers S1, S2, S11 and S12 are not limited to radiation thermometers. They can be, for example, thermocouples.

As stated above, the radiation thermometers S1 and S2, and S11 and S12 measure each temperature close to the center portion and the end portion of the susceptor 2 and the substrate 1 from the back side of the susceptor 2 and from the surface side of the substrate 1. Each measured value obtained by such a measurement is added into an arithmetic means 25 to provide a command value obtained by computation to a control means 26. By controlling the resistance heating heater 3 and the vertical movement mechanism 10 by the control means 26, the warpage state of the substrate is controlled.

Here, the temperature of the susceptor 2 may be simply monitored as a warpage amount of the substrate 1 which has a correlation with the temperature of the susceptor 2 based on the measured values of the radiation thermometers S1 and S2. The monitored data becomes a data for an empirical technique. In addition, taking this monitoring a step further, the control of the warpage amount may also be performed as mentioned above. In the case of the former, the arithmetic means 25 constitutes a monitor means, and an output of the monitor means is the warpage amount. In the case of the latter, the control means 26 constitutes a warpage control means.

Figure 12:
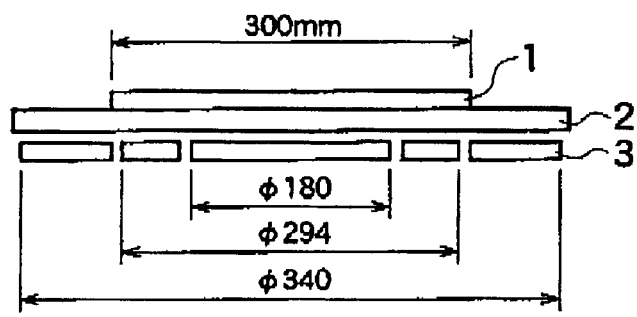
FIG. 12 is an explanatory view for showing a heater structure according to an embodiment.

Although the resistance heating heater 3 may be an integral type, it is preferable that the heater 3 be a division type heating heater comprising a plurality of concentrically disposed zone heaters 3a, 3b and 3c as shown in FIG. 11 and FIG. 12. The central zone heater 3a, the intermediate zone heater 3b and the circumferential zone heater 3c constitute a central heating means, an intermediate heating means and a circumferential heating means respectively. In the case of the division type heater, a plurality of the zone heaters is individually controlled in accordance with command values corresponding to the plurality of the zone heaters. In the embodiment, although only the central zone heater 3a (a portion of φ 180 in FIG. 12) is controlled such that it is within the condition of such a temperature deviation Δt in the substrate surface that no warpage of the substrate occurs, even other zone heater may be used and controlled. In addition, although the susceptor is not divided, it may be divided at a point corresponding to a heater division position. When dividing, it is preferable that the susceptor be divided at a point corresponding to the point at least between φ 180 and φ 294 heaters.

Figure 4:
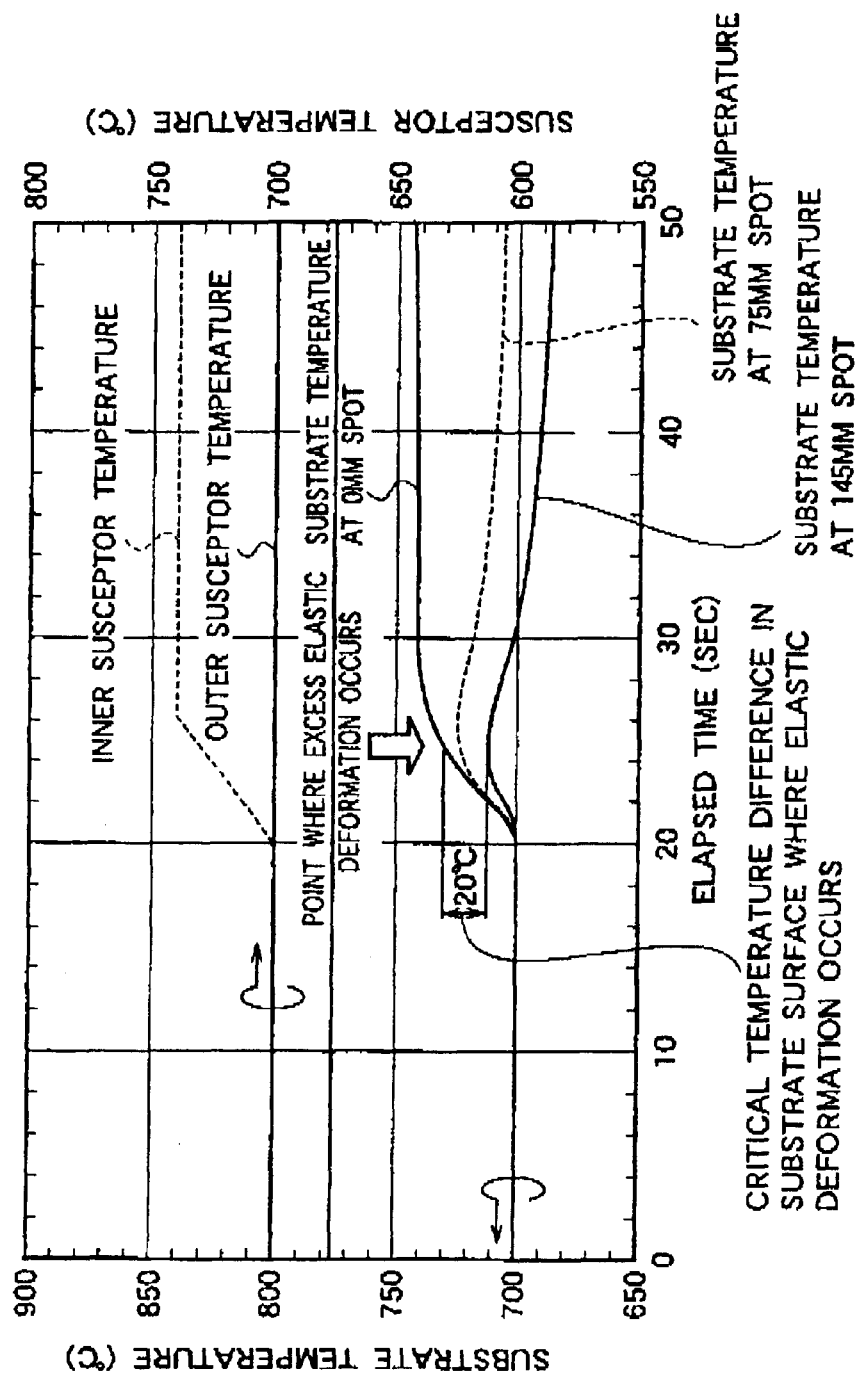
FIG. 4 is a characteristic view of a correlation between a susceptor temperature and a substrate temperature according to an embodiment.

Now, FIG. 4 shows a change with time in a temperature in a substrate surface when changing purposely an inner susceptor temperature corresponding to a substrate center portion neighborhood from a state after temperature stabilization of the above-described procedure (4) in a φ 300 mm Si substrate. An aim of obtaining the data of FIG. 4 is to discover what amount of the temperature deviation in the substrate surface allows the excess substrate elastic deformation which is the problem of the present invention to be generated and occur.

Figure 5:
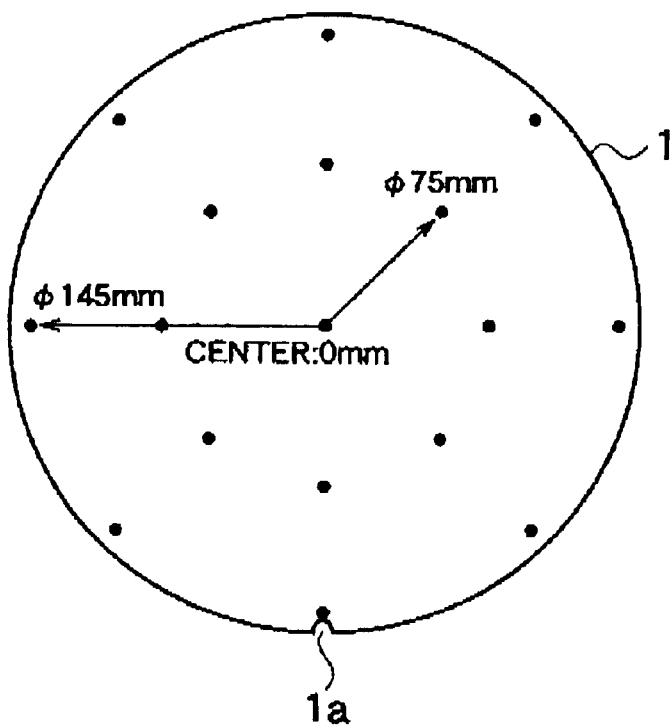
FIG. 5 is an explanatory view of substrate temperature measuring points according to an embodiment.

The change of the inner susceptor temperature is realized by independently controlling the respective temperatures of the arbitrary regions as mentioned above into which the resistance heating heater 3 is divided. In addition, with respect to the measurement points of the substrate temperature, thermocouples (the radiation thermometers S11 and S12 are not used) are located at a plurality of points of 75 mm and 145 mm radially from the center of the substrate which is set to be 0 mm as shown in FIG. 5, and an average of temperature values at the same radius are taken, and the results are graphed in FIG. 4. Moreover, with respect to the inner susceptor temperature, a temperature at a spot of the substrate center 0 mm is measured, and with respect to the outer susceptor temperature, a temperature at a spot φ 147 mm is measured. Furthermore, since the susceptor is an integrated type (that is, there is no division between the outer and the inner), with respect to the inner susceptor temperature, it is proper that the inner susceptor temperature correctly be an expression of a susceptor temperature at an inner portion. Additionally, the thickness of the φ 300 mm (12 inches) Si substrate, which varies depending on quality, is 0.775 mm±0.025 µm–0.775 mm±0.050 µm.

In FIG. 4, in a state of an elapsed time of 0–20 sec before the inner susceptor temperature is changed, the substrate temperature is maintained at a state of approximately 700° C. due to uniformalization of the susceptor temperature. Then, until an elapsed time 20–26 sec, the entire substrate temperature exhibits an upward tendency with a temperature increase of the inner susceptor. In addition, the temperature increase amount for each measurement point is an increase amount corresponding to the temperature increase region of the inner susceptor, and specifically, the substrate temperature increase amount at the 145 mm spot which is farthermost from a temperature increase region is lower than that at the substrate center portion, and the temperature deviation in the substrate surface exhibits a tendency to be gradually enhanced with an elapsed time. Moreover, from an elapsed time 24 sec, although the substrate temperature progression at the 0 mm point exhibits a temperature progression corresponding to the temperature increase amount of the susceptor, and with respect to 75 mm and 145 mm points, the temperature gradually decreases, and with respect to 145 mm point, the temperature in a final stabilized state exhibits a tendency to decrease to be less than the initial excess state.

Figure 6:
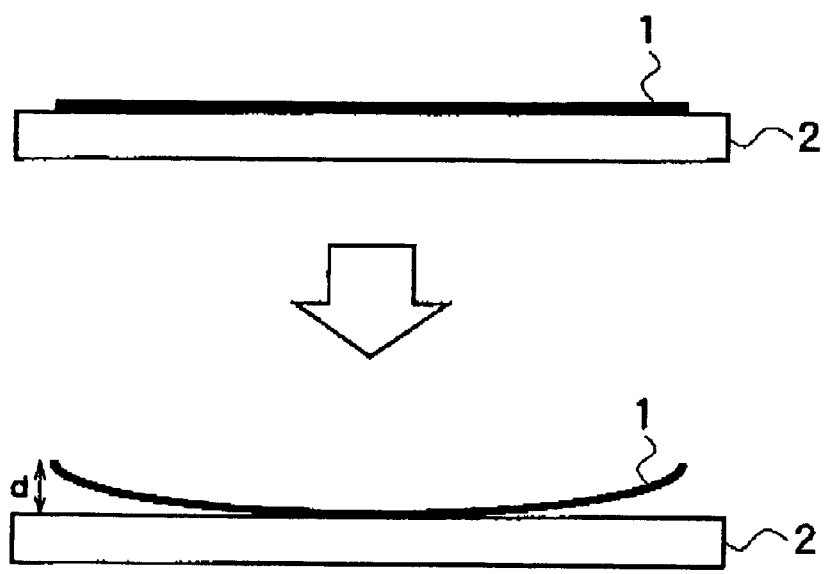
FIG. 6 is a conceptual view of an elastic deformation of a substrate according to an embodiment.

Furthermore, FIG. 6 shows an elastic deformation conceptual view (a cone shape or a horseshoe shape) of a substrate, and the elastic deformation state of the substrate has been visually checked experimentally, and it has been found that the elastic deformation amount is: d=5–10 mm or so.

In consideration of the progression of substrate temperature change in FIG. 4 and the substrate elastic deformation conceptual view of FIG. 6, it is estimated that timing of occurrence of the elastic deformation of the substrate is at a spot near an elapsed time 25 sec in FIG. 4. This is determined by an explanation that a distance between substrate 1 and susceptor 2 is caused by an excess substrate elastic deformation so that a heat transfer effect from the susceptor 2 is decreased so as to provide temperature decrease tendencies at 75 mm and 145 mm points from an elapsed time 25 sec. Therefore, the temperature difference in the substrate surface near an elapsed time 25 sec is indicative of a critical state in which the excess elastic deformation of the substrate is caused, and it can be said that the substrate elastic deformation which is caused by the occurrence of the temperature difference equal to or more than a critical temperature deviation depending on the substrate temperature when raising a temperature, is liable to occur in a temperature raising process in which the temperature deviation in the substrate surface is liable to lapse into an uncontrolled state.

In view of the forgoing, the present embodiment resides in inhibition of the elastic deformation of a substrate by controlling a substrate temperature within such a substrate temperature deviation that no warpage occurs even in a temperature raising process.

Figure 7:
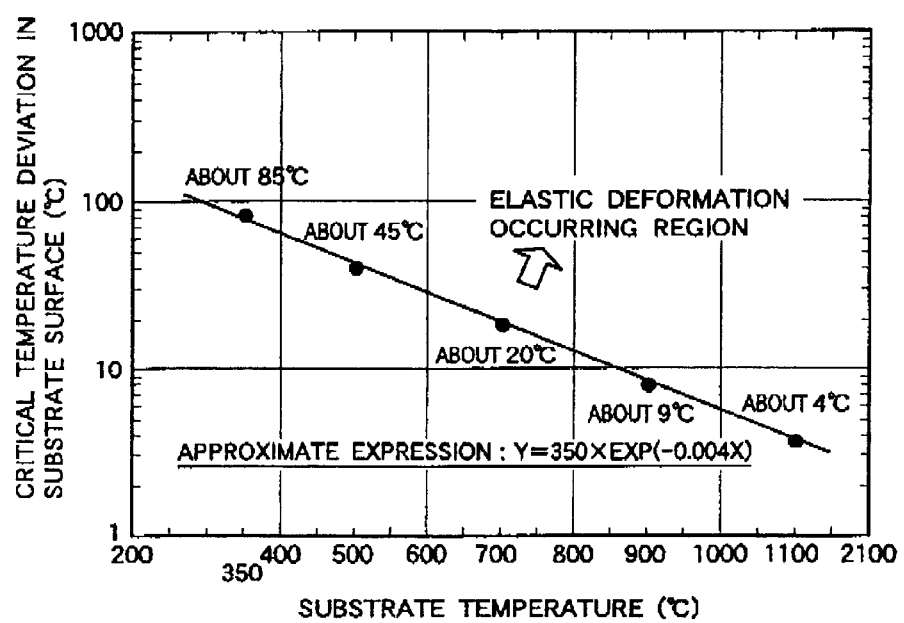
FIG. 7 is an explanatory view for showing a substrate temperature and a critical temperature deviation in a substrate surface according to an embodiment.

FIG. 7 is a graph made of critical temperature differences in a substrate surface in each temperature range in a temperature raising process which is obtained at points of 350° C., 500° C., 700° C. 900° C. and 1100° C. as data in FIG. 4. The obtained data in FIG. 7 shows that there is a correlation between a substrate temperature: X and a critical temperature difference in a substrate surface, Y, which can be represented by the following approximation expression:

$$Y = 350 \times EXP(-0.004 \times X).$$

Accordingly, in order to inhibit a substrate elastic deformation in a temperature raising process, it is essential that the temperature deviation: Δt (° C.) In a substrate surface during a temperature raising have a relation to the substrate temperature T (° C.) during the temperature raising as follows;

$$\Delta t \leq 350 \times EXP(-0.004 \times T) \tag{a},$$

wherein Δt: a temperature deviation (° C.) in a substrate surface during a temperature raising, and T: a substrate temperature (° C.) during the temperature raising.

Therefore, by monitoring the substrate temperature during a processing, and controlling the resistance heating heater 3 which is optimally divided to heat an arbitrary substrate region, such that the relation expression (a) which has been obtained by the above-described experiment is satisfied, an excess elastic deformation of the substrate can be inhibited so that the substrate can be heated uniformly.

A method for obtaining temperature information about the temperature controlling method for prevention of an elastic deformation of the substrate 1 can include (A) an empirical technique for experimentally optimizing a heating sequence when substrate information and the like are known in advance, (B) a technique for directly obtaining temperature information about a substrate surface by a known optical technique such as a radiation thermometer and the like. In either case, while preventing a substrate warpage, a temperature rising speed can be enhanced by performing a feedback control on a heating element such as a resistance heating heater and the like such that a temperature difference in a substrate surface and a substrate temperature range satisfy the above-noted relation expression, which relate to the obtained temperature information about a substrate, specifically, the temperature information about a center portion of the substrate and a portion which is in the order of 10 mm from at least an outer circumference of the substrate.

In addition, two techniques for preventing a substrate warpage due to a temperature deviation in a substrate surface beyond the above-noted Δt immediately after substrate insertion, will be described below. Firstly, a substrate processing method (A) based on an experimental technique which has a reliable long-term monitoring accuracy will be described. Secondly, a substrate processing method (B) based on an experimental technique which has a reliable short-term monitoring accuracy which leaves a long-term problem will be described.

(A) A Substrate Processing Method by an Experimental Technique

Figure 8:
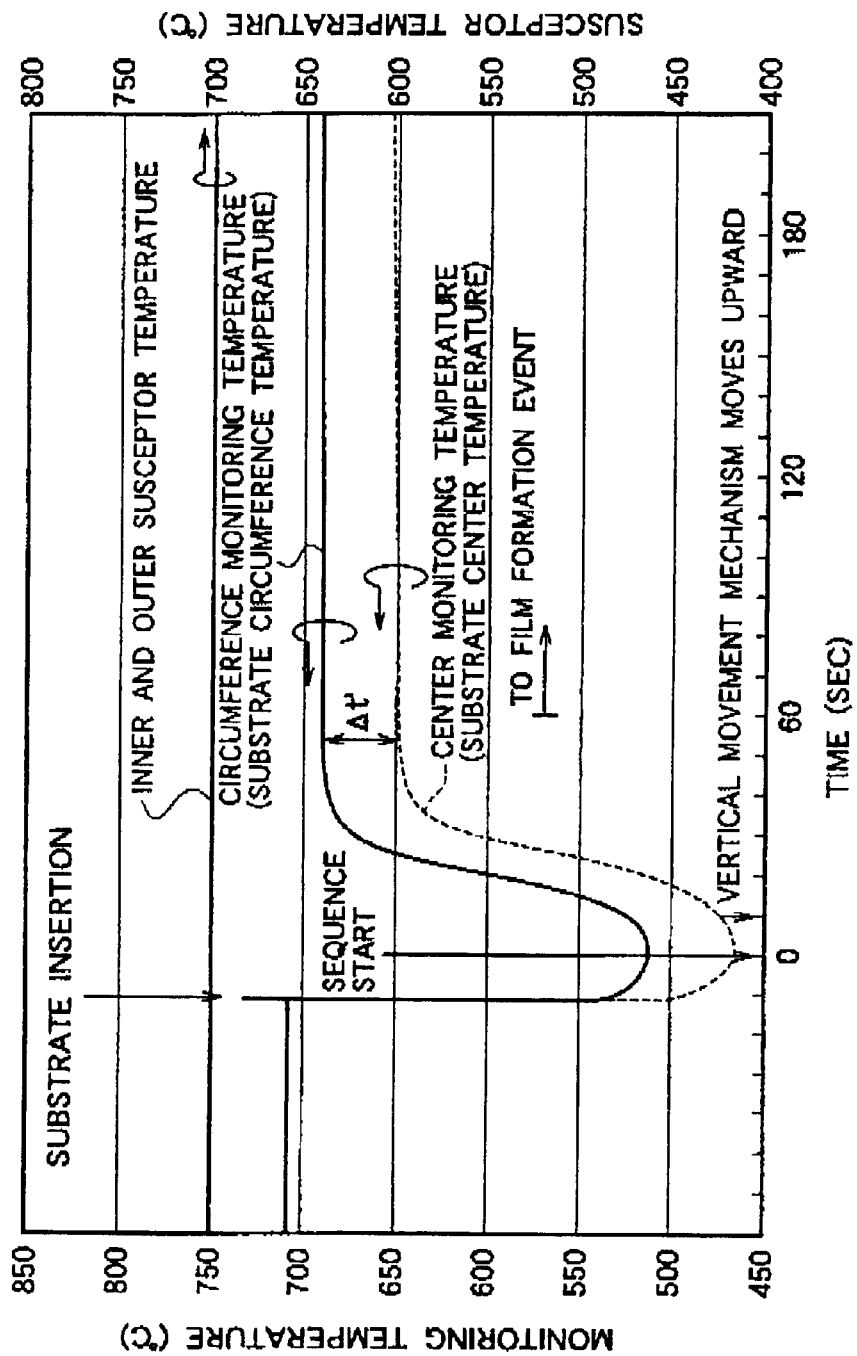
FIG. 8 is an explanatory view for showing a substrate temperature recovery by a sequence of a conventional example.

FIG. 8 is a graph for showing a change with time in a substrate temperature during a processing by a conventional sequence. Here, a procedure is the same as in the above-stated procedures (1) to (3). The measurement of a substrate temperature (center and circumference monitoring temperatures) is adapted to allow a temperature measurement after a substrate insertion to be possible by locating on the gas dispersion plate 5 of FIG. 1 and FIG. 2 the radiation thermometers S11 and S12 for observing a substrate processing surface. Moreover, the measurement of a susceptor temperature (inner and outer temperatures) is adapted to allow a temperature measurement after a substrate insertion to be possible by locating on the resistance heating heater 3 the radiation thermometers S1 and S2 for observing a susceptor back surface temperature. Furthermore, the temperature measurement with S11 and S12 is conducted at two points, namely, at the substrate center portion, and at the circumference portion which is an approximately 140 mm spot from the center portion. Additionally, in the present experiment sequence for the main purpose of measuring a substrate temperature, in order to maintain reliability of the radiation thermometers, an N$_2$ gas with a flow rate which is equivalent to the flow rate in a film formation sequence is supplied in lieu of a reaction gas without supplying the reaction gas into the processing chamber which would be supplied when forming a film. The resistance heating heater 3 which is divided into a center and a circumference is respectively controlled from the time before insertion of a substrate such that the susceptor back surface temperature becomes 700° C., and the temperature before insertion of a substrate is maintained during a processing.

The ordinate at the left of the graph represents the substrate center temperature (center monitoring temperature) and the substrate circumference temperature (circumference monitoring temperature) measured with S11 and S12, and the ordinate at the right of the graph represents the susceptor back surface temperatures of an inner susceptor and an outer susceptor measured with S1 and S2. When the substrate 1 and the susceptor 2 are rotated, the radiation thermometer S1 located at the substrate center portion makes a fixed point observation on the temperature of the inner (center portion) of the susceptor 2 from the back surface side of the susceptor 2. The radiation thermometer S2 located in the substrate end portion neighborhood draws a circular measurement locus so that the radiation thermometer S2 makes an observation on the temperature of the outer (circumferential end portion) of the susceptor 2. In the case of the substrate rotation speed=10 rpm, the radiation thermometer S2 repeatedly measures the temperature of the same spot on the circular measurement locus in a cycle of 6 sec.

The time of the abscissa of the graph allows a sequence start time after insertion of the substrate into the processing chamber to be 0 sec, and after about 10 sec, by allowing the vertical movement mechanism 10 to move up, the substrate is moved to a processing position.

In FIG. 8, the monitoring temperature before insertion of the substrate which monitors a susceptor surface temperature at a substrate transfer position, indicates a temperature slightly higher than a control temperature immediately below the susceptor back surface. The monitoring temperature after insertion of the substrate which is at a room temperature is suddenly decreased, and subsequently it begins increasing due to a contact of the substrate with the susceptor 2 at a high temperature along with the upward movement of the vertical movement mechanism 10, and after a while, it is maintained at a constant temperature. However, in the monitoring temperature even in a steady state, a temperature difference Δt' between the substrate center portion and the circumference portion is generated to be a temperature difference of about 40° C. and this temperature difference in the substrate surface is not eliminated even when transferring to the film formation event. It is estimated that this phenomenon is generated by the nonuniformity of the degree of contact in the substrate surface as mentioned in FIG. 3 when supporting the substrate 1 by the susceptor 2 as a result of the occurrence of the elastic deformation of the substrate 1 by the temperature difference in the substrate surface which is results from the difference in temperature rising speed between the substrate center portion and the circumference portion immediately after the insertion of the substrate. Moreover, in another consideration, it is estimated that the substrate 1 after insertion which is in an insufficiently heated state is brought into contact with the susceptor 2 at a high temperature so that an instantaneous heating unevenness occurs in the substrate surface when a temperature suddenly increases, and the heating unevenness causes the elastic deformation of the substrate 1. Furthermore, in the graph of FIG. 8, since the monitoring temperature at the center portion is lower than that at the circumference portion, the resultant elastic deformation of the substrate is a conical distribution in which the surface side is curved in a convex manner.

Figure 9:
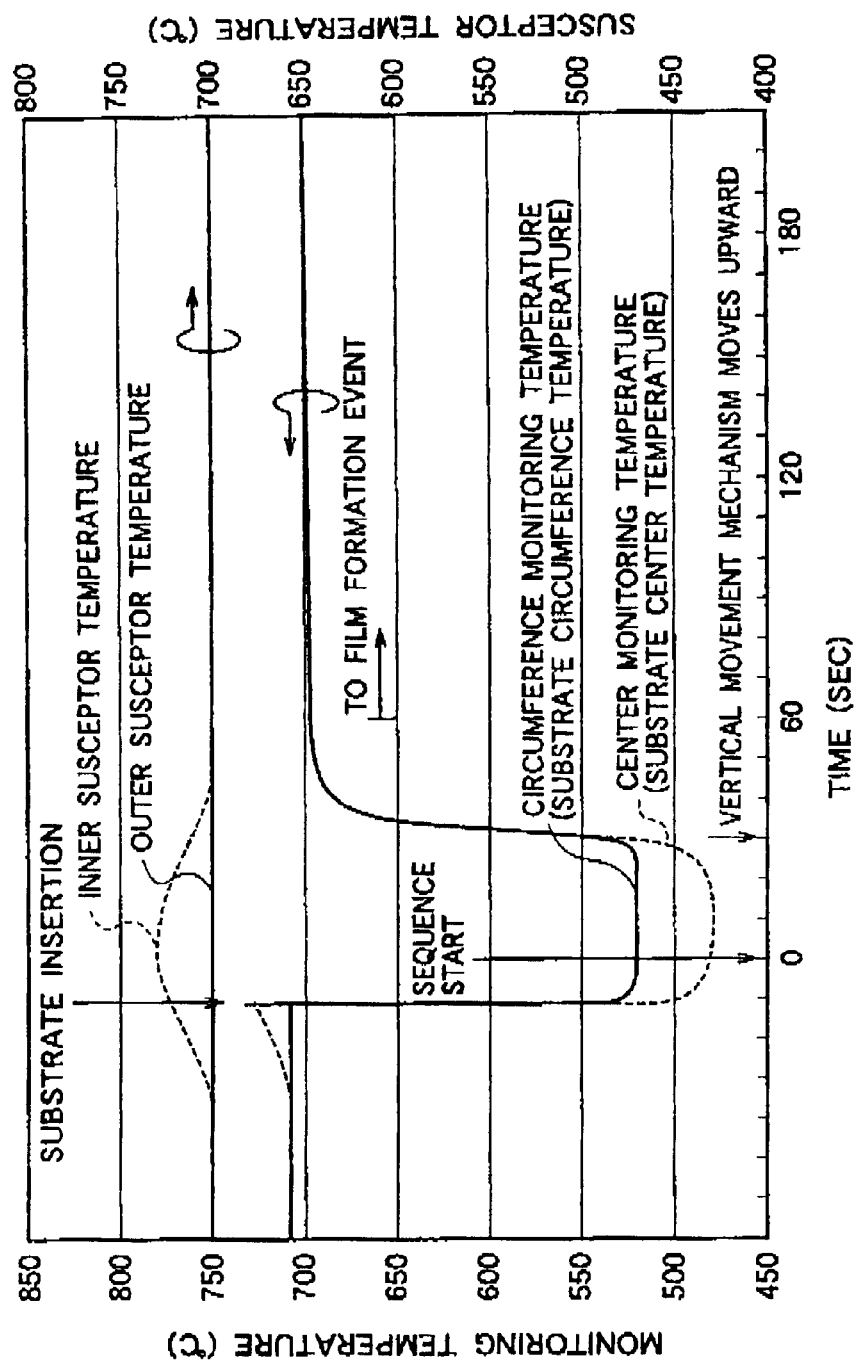
FIG. 9 is an explanatory view for showing a substrate temperature recovery by a sequence according to an embodiment.

FIG. 9 shows change with time in a substrate temperature by a sequence according to the present embodiment, and a difference of the sequence in FIG. 9 from the conventional sequence in FIG. 8 is as follows.

(1) As a means for uniformalizing a temperature rising speed in a substrate surface immediately after insertion of the substrate, by temporarily setting the temperature of an inner susceptor higher than the design temperature during a substrate processing, the heating of the substrate center portion which has a low temperature rising speed is accelerated. An increase amount of the setting temperature and a timing of changing the setting temperature are optimized by experiment, and in FIG. 9, by increasing the temperature of the inner susceptor by the amount of change of 1° C./sec from the time approximately 20 sec before the insertion of the substrate, the temperature of the inner susceptor is increased to a temperature 30° C. higher than the initial setting temperature, for about 30 sec until the time when the processing sequence starts. After increasing, by decreasing the temperature of the inner susceptor by the amount of change of 1° C./sec, the temperature of the inner susceptor is returned to the initial design temperature for about 50 sec until before a film formation event, so that the temperature of the inner susceptor is equal to the temperature of the outer susceptor which corresponds to the substrate circumference neighborhood.

(2) As a means for inhibiting a sudden temperature change in a substrate surface when the substrate 1 comes into contact with the susceptor 2 at a high temperature, the substrate is brought into contact with the susceptor 2 after the temperature of the substrate increases subsequently to the insertion of the substrate to a certain temperature or more which corresponds to the temperature approximately 700° C. of the susceptor 2. In the present experimental example, for the temperature approximately 700° C. of the susceptor 2, when the substrate temperature (monitoring temperature) becomes about 450–500° C., the substrate is brought into contact with the susceptor 2. That is, it is preferable that the substrate be brought into contact with the susceptor 2 around where a temperature curve of the substrate center temperature which suddenly increases by the over setting temperature of the inner susceptor catches up with and overlaps a temperature curve of the substrate circumference temperature which increases by a setting temperature heating of the outer susceptor. In addition, it is desirable that the temperature increase of the substrate 1 be accelerated by allowing the distance between the susceptor 2 and the substrate 1 to be as short as possible from the time when the processing sequence starts to the time when the substrate 1 is brought into contact with the susceptor 2 by the upward movement of the vertical movement mechanism 10. The present experiment is conducted by setting the distance between the substrate 1 and the susceptor 2 at about 2 mm during the above-noted processing.

In this way, by the empirical optimization techniques of the heating and vertical movement sequence according to (1) and (2), the monitoring temperature difference of 40° C. between the substrate center portion and the substrate circumference portion resulting from the sudden decrease after insertion of the substrate at a room temperature, is eliminated to be zero when the vertical movement mechanism moves upward, and the temperature difference zero is maintained when transferring to the film formation event.

Figure 10:
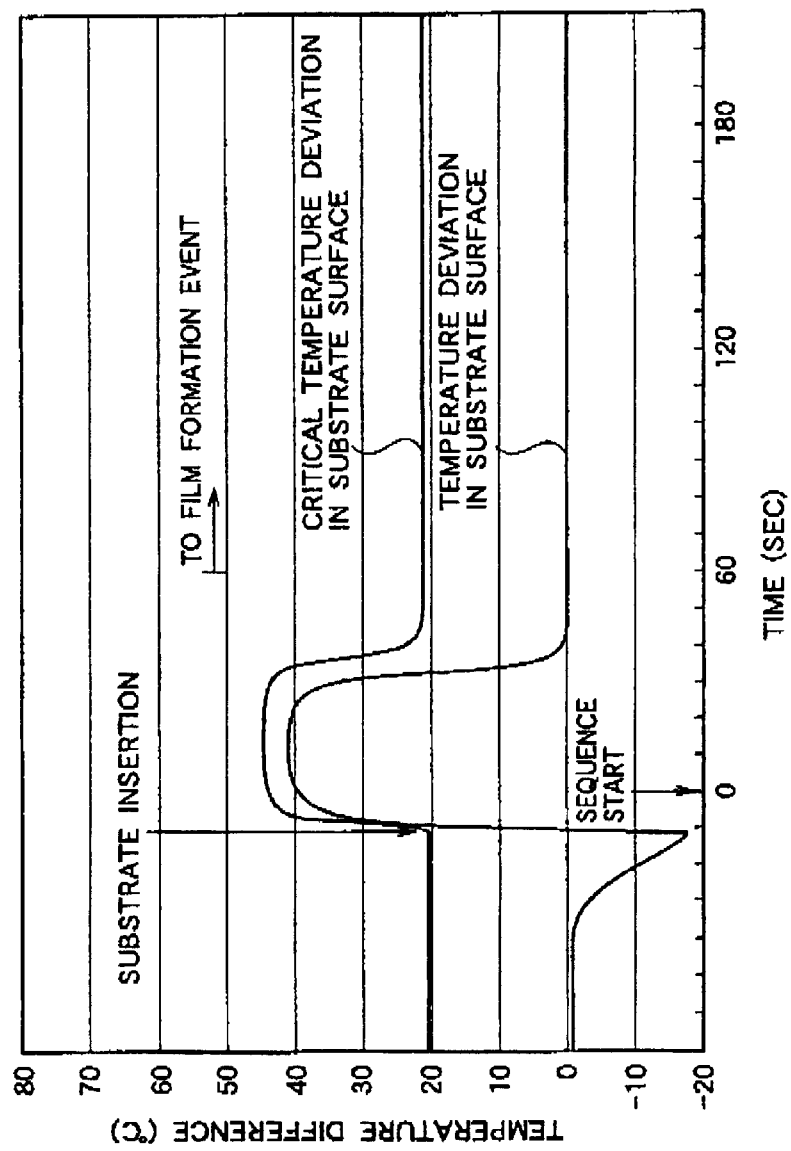
FIG. 10 is an explanatory view for showing a change with time in a temperature deviation in a substrate surface by a sequence according to an embodiment.

The graph of FIG. 10 shows a change with time in a temperature deviation in a surface between the center portion and the circumference portion of the substrate monitoring temperature performed by the sequence according to the embodiment of the above-mentioned (A). In addition, the graph also illustrates the critical temperature deviation in a substrate surface (temperature deviation in a substrate surface) $\Delta t$ of the expression (a) obtained in the present embodiment. The measured temperature deviation in a substrate surface when conducted by the present embodiment sequence is maintained at a temperature difference equal to or below the critical temperature deviation in a substrate surface at any time, so that the elastic deformation, namely a warpage, of a substrate during a temperature raising can be prevented so as to make it possible to uniformly heat a substrate in the film formation event as shown in FIG. 9.

(B) A Substrate Processing Method by a Feedback Control

This method is a control method based on the conditional expression (a) of $\Delta t$. As shown in FIG. 10, the vertical movement mechanism 10 and the zone heater 3a as a center heating means are controlled so that the measured temperature deviation in a substrate surface does not exceed the critical temperature deviation $\Delta t$ in a substrate surface. Based on the experimental results of (1) and (2) of the above-noted (A), control parameters are determined as follows. The control parameters of the zone heater 3a which are added to the arithmetic means 25 are the substrate temperatures (S11 and S12) before and after insertion of the substrate, the increase amount of a setting temperature of the inner susceptor, the timing of changing the setting temperature of the inner susceptor, and the like. Moreover, the control parameters of the vertical movement mechanism 10 which are added to the arithmetic means 25 are the distance between the susceptor 2 and the substrate 1 before contact of the susceptor 2 with the substrate, the substrate temperature when bringing the susceptor 2 into contact with the substrate 1, and the like.

The arithmetic means 25 computes a warpage amount based on the measurement values of the radiation thermometers S1 and S2, and then the arithmetic means 25 obtains by computation a command value which corrects the warpage amount so as to provide the command value to the control means 26. Based on the command value provided by the arithmetic means 25, the control means 26 controls the zone heater 3a, and consequently controls the warpage state of the substrate. In addition, the arithmetic means 25 computes a warpage amount based on the measurement values of the radiation thermometers S11 and S12, and then the arithmetic means 25 obtains by computation a command value which corrects the warpage amount so as to provide the command value to the control means 26. Based on the command value provided by the arithmetic means 25, the control means 26 controls a drive source 10a of the vertical movement mechanism 10, and consequently controls the warpage state of the substrate. By this feedback control, the temperature deviation in a substrate surface when conducted by the feedback control, can be maintained at a temperature difference equal to or below the critical temperature deviation in a substrate surface at any time, so that the elastic deformation of a substrate during a temperature raising can be prevented so as to make it possible to uniformly heat a substrate in the film formation event as shown in FIG. 9. Moreover, in lieu of the above-stated computation, results may be obtained using a lookup table. Therefore, since there is no need for calculation every time results are required, speedup of control becomes possible.

As mentioned above, according to the embodiments, the following excellent effects are obtained as compared to the known examples.

(1) Based on such a temperature deviation in a substrate surface that no warpage occurs at a substrate temperature in the midstream of a substrate temperature raising, heating is controlled by allowing $\Delta t$ to be variable up to a setpoint temperature. As a result, heating need not be severely controlled when the substrate is at a low temperature with a large margin of a $\Delta t$, by using a $\Delta t$ value when being at a high temperature, and moreover, since the $\Delta t$ margin is large when being at a low temperature, it can be ensured that the temperature rising speed is increased while a warpage can be inhibited.

(2) Since a warpage of a substrate in the midstream of a substrate temperature raising can be effectively prevented, a fear of film peeling off resulting from the warpage is significantly reduced after processing.

(3) Since heating of a substrate is controlled such that no warpage occurs in the midstream of a substrate temperature raising, an elastic deformation of the substrate due to a temperature difference in a substrate surface can be inhibited and a substrate processing such as a film formation and the like can be conducted in a temperature uniform state in a substrate surface. Accordingly, defective of substrate property such as a film thickness uniformity and the like can be prevented, which can contribute to an enhanced yield of semiconductor elements.

In addition, although the inhibition condition of the substrate elastic deformation in a heating processing in the embodiment which takes an Si substrate of $\phi 300$ mm as an example, is represented by the specific function of temperature, optimization of an inhibition condition of the substrate elastic deformation even in a variety of materials is possible by discovering dependence of the inhibition condition using the experimental procedure based on the intention of the present invention. Moreover, it goes without saying that the scope of the present invention is to be limited solely by the appended claims, and that various changes and modifications can be made within the scope without departing from the intention of the invention. For example, the present invention can be applied to a GaAs substrate, in addition to an Si substrate.

Furthermore, although a warpage of a substrate during a temperature raising is mainly prevented in the above-mentioned embodiment, the present invention can also be applied to the case of preventing a warpage in a steady state or when lowering a temperature.

Additionally, during a temperature raising, the control may be possible by allowing $\Delta t$ to be variable while the substrate temperature (or the susuceptor temperature) is measured in real time, and the control may be possible by allowing $\Delta t$ to be variable based on the data which has been obtained in advance using a test substrate and the like. In this case, without controlling the heating of a substrate based on the linear approximate expression (a) in which $\Delta t$ varies continuously in accordance with the substrate temperature, the controlling may be possible based on a stepped line graph in which $\Delta t$ varies discontinuously. That is, a temperature region is divided into at least two regions, and the temperature deviation value in a substrate surface in one temperature region is different from that in another temperature region, while the temperature deviation value in a substrate surface in each temperature region is constant, so that the heating of the substrate may be more simply controlled.

Furthermore, in the embodiment which represents an expression of $\Delta t$ based on the substrate temperature, since a susceptor back surface temperature is actually measured, if a relation with the substrate temperature-susceptor temperature is obtained, there is no need to directly measure the substrate temperature so that the control only by the susceptor back surface temperature becomes possible. Since measuring the susceptor back surface temperature circumvents the need to expose the thermometer to the reaction space, deposition of an unwanted film onto the thermometer can be prevented so that reliability of a long-term monitoring accuracy can be secured.

Moreover, the conditional expression of the expression (a) relates to an Si substrate of 300 mm, and it has been experimentally confirmed that the expression (a) holds in either case, 100 or 111 crystal face. Further, the $\Delta t$ conditional expression in the embodiment is calculated based on the measuring locations of the center (0 mm) of an Si substrate and 145 mm from the center. Even though a different $\Delta t$ conditional expression calculated from other measuring locations is used, measurements at 0 mm and 145 mm consequently will satisfy the above-noted $\Delta t$ conditional expression.

According, to the present invention, heating of a substrate can be controlled based on a temperature deviation in a substrate surface $\Delta t$ so that occurrence of a warpage of the substrate can be effectively prevented.

What is claimed is:

1. A substrate processing apparatus which heats a substrate using a heating member capable of performing an unequal heating in a substrate surface, comprising a controller, said controller being adapted to obtain in accordance with a heating state of the substrate such a temperature deviation $\Delta t$ in the substrate surface, which varies in accordance with the heating state of said substrate, that no warpage of said substrate occurs, and said controller being adapted to control said heating member such that a temperature deviation in the surface of said substrate which is heated by said heating member is maintained within said $\Delta t$.

2. A substrate processing apparatus which heats a substrate using a heating member capable of performing an unequal heating in a substrate surface, comprising a controller, said controller being adapted to obtain a $\Delta t$, which varies in accordance with a temperature when heating, for each of a plurality of temperatures which are selected from said temperatures when heating, said temperature when heating being a temperature of the substrate or a temperature of a substrate support member for supporting said substrate, said $\Delta t$ being such a temperature deviation in the substrate surface that no warpage of said substrate occurs, and said controller being adapted to control said heating member such that a temperature deviation in the surface of said substrate which is heated by said heating member is maintained within said $\Delta$ t based on the temperature of the substrate support member or the substrate temperature at that time.

3. A substrate processing apparatus according to claim 2, wherein the temperature deviation $\Delta t$ in said substrate surface which is obtained in accordance with the temperature of the substrate when heating, is represented by the following expression:

$$\Delta t \leq 350 \times EXP(-0.004 \times T),$$

wherein T is the temperature of the substrate.

4. A substrate processing apparatus according to claim 3, wherein a size of said substrate is 12 inches, said $\Delta t$ is a temperature deviation in a surface between a center of said substrate and a position of 145 mm from the substrate center.

5. A substrate processing apparatus according to claim 2, wherein the temperature deviation $\Delta t$ in said substrate surface is obtained in accordance with a temperature of the substrate support member for supporting said substrate.

6. A substrate processing apparatus according to claim 5, wherein as the temperature of said substrate support member, a temperature of a back surface of the substrate support member opposite to a surface which supports said substrate is measured.

7. A substrate processing apparatus according to claim 1, wherein the control of said heating member is a control during a temperature raising process of said substrate.

8. A substrate processing apparatus, which heats a substrate using a heating member capable of performing an unequal heating in a substrate surface, and which controls heating of said substrate at least between a first temperature and a second temperature which is different from the first temperature, the substrate processing apparatus comprising a controller, the controller controlling the heating of said substrate such that a temperature deviation in said substrate surface is maintained within a range such that no warpage of the substrate occurs, and wherein a temperature deviation value in the substrate surface at said first temperature and a temperature deviation value in the substrate surface at said second temperature are set to be different, and the heating of the substrate is controlled by using these temperature deviation values which are different values from each other.

9. A substrate processing apparatus according to claim 8, wherein said second temperature is a temperature higher than said first temperature, the temperature deviation value in the substrate surface at the first temperature is a value larger than that of the temperature deviation value in the substrate surface at the second temperature, and the heating of the substrate is controlled by using these temperature deviation values which are different values from each other.

10. A method for manufacturing a semiconductor device using a substrate processing apparatus:

wherein said substrate processing apparatus comprising:
a heating member which heats a substrate, and which is capable of performing an unequal heating in a substrate surface; and
a controller which is adapted to obtain in accordance with a heating state of the substrate such a temperature deviation $\Delta t$ in the substrate surface, which varies in accordance with the heating state of said substrate, that no warpage of said substrate occurs, and which is adapted to control said heating member such that a temperature deviation in the surface of said substrate which is heated by said heating member is maintained within said $\Delta t$.

11. A method for manufacturing a semiconductor device, using a substrate processing apparatus:

wherein said substrate processing apparatus comprising:
a heating member which heats a substrate, and which is capable of performing an unequal heating in a substrate surface, and
a controller which is adapted to obtain a $\Delta t$, which varies in accordance with a temperature when heating, for each of a plurality of temperatures which is selected from said temperatures when heating, said temperature when heating being a temperature of the substrate or a temperature of a substrate support member for supporting said substrate, said $\Delta t$ being such a temperature deviation in the substrate surface that no warpage of said substrate occurs, and which is adapted to control said heating member such that a temperature deviation in the surface of said substrate which is heated by said heating member is maintained within said $\Delta t$ based on the temperature of the substrate support member or the substrate temperature at that time.

12. A method for manufacturing a semiconductor device using a substrate processing apparatus:

wherein said substrate processing apparatus comprising:
a heating member which heats a substrate, and which is capable of performing an unequal heating in a substrate surface, and
a controller which controls heating of said substrate at least between a first temperature and a second temperature which is different from the first temperature, and which controls said heating member such that a temperature deviation in said substrate surface is maintained within a range such that no warpage of the substrate occurs,
wherein a temperature deviation value in the substrate surface at said first temperature and a temperature deviation value in the substrate surface at said second temperature are different from each other.

13. A substrate processing apparatus according to claim 2, wherein the control of said heating member is a control during a temperature raising process of said substrate.

14. A substrate processing apparatus, comprising:
a heating member which heats a substrate, and which is capable of performing an unequal heating in a substrate surface; and
a controller which controls heating of said substrate at least between a first temperature and a second temperature which is different from the first temperature, and which controls said heating member such that a temperature deviation in said substrate surface is maintained within a range such that no warpage of the substrate occurs,
wherein a temperature deviation value in the substrate surface at said first temperature and a temperature deviation value in the substrate surface at said second temperature are different from each other.

* * * * *